US009039836B2

(12) United States Patent
Donet et al.

(10) Patent No.: US 9,039,836 B2
(45) Date of Patent: May 26, 2015

(54) DEVICE FOR THE SYNTHESIS OF NANOPARTICLES BY FLUIDIZED-BED CHEMICAL VAPOR DEPOSITION

(75) Inventors: Sébastien Donet, Meaudre (FR); Lionel Filhol, Saint Sauveur (FR); Stéphanie Thollon, Salles (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 459 days.

(21) Appl. No.: 13/123,171

(22) PCT Filed: Sep. 10, 2009

(86) PCT No.: PCT/FR2009/001084
§ 371 (c)(1),
(2), (4) Date: Apr. 11, 2011

(87) PCT Pub. No.: WO2010/040908
PCT Pub. Date: Apr. 15, 2010

(65) Prior Publication Data
US 2011/0220024 A1  Sep. 15, 2011

(30) Foreign Application Priority Data

Oct. 9, 2008  (FR) ...................................... 08 05584

(51) Int. Cl.
*C23C 16/00*  (2006.01)
*C23C 16/442*  (2006.01)
(Continued)

(52) U.S. Cl.
CPC ........... *C23C 16/442* (2013.01); *C23C 16/4417* (2013.01); *B01J 23/42* (2013.01);
(Continued)

(58) Field of Classification Search
CPC . C23C 16/4417; C23C 16/442; B01J 31/0221
USPC ..................................... 118/716, 726, DIG. 5
See application file for complete search history.

(56) References Cited

U.S. PATENT DOCUMENTS 3,822,140 A * 7/1974 Gyarmati et al. ................. 427/6
3,889,631 A * 6/1975 Lackey et al. ................. 118/308
(Continued)

FOREIGN PATENT DOCUMENTS

DE  2 306 402  9/1973
FR  2 354 611  1/1978
(Continued)

OTHER PUBLICATIONS

International Search Report issued Nov. 26, 2009 in PCT/FR09/01084 filed Sep. 10, 2009.

*Primary Examiner* — Karla Moore
(74) *Attorney, Agent, or Firm* — Oblon, McClelland, Maier & Neustadt, L.L.P.

(57) ABSTRACT

A device for vapor deposition of chemical species on support grains of spherical or similar shape disposed in a fluidized bed. The device includes a first chamber including a fluidized bed in which a funnel-shaped fluidizer element is housed to receive support grains of spherical or similar shape; a second chamber in fluid flow connection with the first chamber to deliver precursors in a vapor phase of chemical species to be deposited on the support grains and to convey a fluidizing gas towards the first chamber; and a flute at an inlet to the fluidizer element to control distribution of the vapor phase precursors and the fluidizing gas within the fluidizer element. The distributor flute includes one or more outer grooves, each groove including a first portion oriented along the longitudinal axis of the flute and a second portion winding helically around the axis to generate a fluidizing gas vortex within the first chamber.

14 Claims, 4 Drawing Sheets

(51) Int. Cl.
 *C23C 16/44* (2006.01)
 *B01J 23/42* (2006.01)
 *B01J 35/00* (2006.01)
 *B01J 37/02* (2006.01)
 *C01B 3/00* (2006.01)
 *C23C 16/455* (2006.01)

(52) U.S. Cl.
 CPC ......... *B01J 35/006* (2013.01); *B01J 37/0221* (2013.01); *B01J 37/0238* (2013.01); *B22F 2998/00* (2013.01); *C01B 3/0026* (2013.01); *C23C 16/45502* (2013.01); *C23C 16/45591* (2013.01); *Y02E 60/327* (2013.01); *Y10S 118/05* (2013.01)

(56) References Cited

U.S. PATENT DOCUMENTS

| | | | |
|---|---|---|---|
| 4,098,224 | A | 7/1978 | Noren et al. |
| 4,342,284 | A | 8/1982 | Loser et al. |
| 6,117,772 | A * | 9/2000 | Murzin et al. ............... 438/681 |
| 2007/0196249 | A1 | 8/2007 | Fridman et al. |
| 2008/0220166 | A1 | 9/2008 | Ege et al. |

FOREIGN PATENT DOCUMENTS

| | | |
|---|---|---|
| JP | 53-45676 | 4/1978 |
| JP | 63 059 350 | 3/1988 |
| WO | 2005 004 556 | 1/2005 |
| WO | 2007 012 027 | 1/2007 |

\* cited by examiner

DEVICE FOR THE SYNTHESIS OF NANOPARTICLES BY FLUIDIZED-BED CHEMICAL VAPOR DEPOSITION

The present invention relates to a device for performing chemical vapor deposition of chemical species on a support.

The invention relates more precisely to a device for performing chemical vapor deposition of said chemical species in a fluidized bed.

In particular, the invention seeks to deposit chemical species on surfaces that are spherical or similar, such as, by way of non-limiting example: powders presenting a grain size that is nanoscopic (1 nanometer (nm) to 100 nm) or microscopic, microporous beads, or molecular sieves, elongate pellets, or granules.

A concrete application for this type of deposition is to be found in particular in making catalytic systems, e.g. for automobile applications (treating nitrogen oxides in exhaust gases), in treating volatile organic compounds (VOCs), of the kind to be found in numerous industrial methods.

BACKGROUND

It is known that chemical vapor deposition (CVD) serves to deposit metallic chemical species (Fe, Ru, Os, Co, Rh, Pd, Pt, etc. . . . ) in the form of nanoparticles on a support.

For this purpose, CVD makes use of organometallic precursors (e.g. metallic salts) of the chemical species, which precursors react at the surface of the substrate in order to deposit the chemical species in question.

The CVD technique can also be used to deposit complete catalytic systems on a support, by enabling chemical species such as oxides ($Al_2O_3$, $CeO_2$, yttria-stabilized zirconia (YSZ), $V_2O_5$, $BaO$, $TiO_2$, etc. . . . ) to be deposited in the form of continuous or discontinuous films on the support, followed by a step of depositing metallic species, as mentioned above.

Nevertheless, depositing such chemical species on spherical or similar surfaces forming a support gives rise to certain difficulties.

Thus, techniques have been proposed for improving the CVD method for depositing chemical species on such so-called spherical or similar surfaces.

To this end, a fluidized bed CVD technique has already been proposed.

Mention may be made for example of document FR 2 825 296 (D1) that discloses a device making use of a fluidized bed CVD technique. The device disclosed in D1 includes a sublimer with an organometallic precursor in solid form located therein, the sublimer being connected to a reservoir of vector gas such that the vector gas is capable of passing through the organometallic precursor in order to cause it to sublime (into the vapor phase). That device also has a column having support grains of spherical or similar shape located therein, said column being placed above the sublimer and being in leak-tight fluid flow connection therewith so that the vapor of the organometallic precursor can be directed to the column. The device also has means for injecting an activation gas to activate the organometallic precursor injected within the sublimer in order to ensure that CVD takes place effectively on the support grains.

Nevertheless, that technique presents a certain number of drawbacks.

There is a risk of the support grains clogging the inlets of the fluidized bed zone.

There is also a risk of the deposited particles of the chemical species in question coalescing. Because injecting precursors into the fluidized bed zone does not necessarily ensure that the precursors are uniformly stirred within said zone, it can happen that deposition takes place in non-uniform manner on the support grains.

Furthermore, the rate of growth of the deposit is difficult to control in such devices. The operation that consists in subliming solid precursors is an operation that is difficult to control. Insofar as the surface areas of the solid precursors in contact with the gas stream passing therethrough varies over time (the shapes of the piles made up by the solid precursor changes, and it is also possible to find impurities or traces of moisture in the gas, thereby modifying the sublimable surface area), the amount of precursor that is sublimed at each instant is poorly controlled.

Furthermore, the sublimation surface area of the solid precursors present in the sublimer decreases over time as the precursors are consumed. Consequently, the rate of deposition of chemical species decreases over time, and the total duration of deposition turns out to be relatively lengthy, usually at least 30 minutes (min).

SUMMARY

An object of the invention is to improve the uniformity of the deposition of the chemical species on the support grains, which grains present a surface that is spherical or similar.

Another object of the invention is to limit or even avoid any risk of support grains clogging the inlet of the fluidized bed zone.

A further object of the invention is to increase the deposition rate of chemical species on the support grains, and to obtain better control thereover.

To achieve at least one of these objects, the invention provides a device for vapor deposition of chemical species on support grains of spherical or similar shape disposed in a fluidized bed, the device comprising: a first chamber having a fluidized bed in which a funnel-shaped fluidizer element is housed in order to receive support grains of spherical or similar shape; a second chamber in fluid flow connection with the first chamber serving both to deliver precursors in the vapor phase of chemical species to be deposited on the support grains and to convey a fluidizing gas towards the first chamber, the device being characterized in that it includes a fluidization element shaped as a funnel placed in the first chamber in order to receive the support grains, and a flute placed at the inlet of the fluidizer element in order to control the distribution of the precursors in the vapor phase and of the fluidizing gas within the fluidizer element.

Various other technical characteristics of the invention may be provided, singly or in combination:

- the distributor flute comprises an inner pipe for passing precursor vapors, the inner pipe being of varying section;
- the ratio between the diameter ($D_e$) of the precursor vapor inlet section into the inner pipe and the diameter ($D_s$) of the outlet section from said pipe is at least 2, and preferably lies in the range 5 to 15;
- the distributor flute includes one or more outer grooves;
- the or each groove includes a first portion oriented along the longitudinal axis of the flute, and a second portion winding helically around said axis in order to generate a fluidizing gas vortex within the first chamber;
- the helical portion of the or each outer groove has a vertical inclination of less than 30°, preferably of less than 20°;
- the or each outer groove presents a width lying in the range 0.3 millimeters (mm) to 1.2 mm, and a depth lying in the range 0.3 mm to 1.2 mm;

one end of the distributor flute includes a recess of a shape that allows shutter means to be placed therein, e.g. a ball;

means are provided for adjusting the position of the distributor flute outlet relative to the inlet of the fluidizer element;

heater means and/or cooling means are provided that are located at the base of the fluidizer element, in order to avoid the inlet of the fluidizer element being clogged by the support grains;

a second pipe is provided that passes through the second chamber and that is leaktight relative to the second chamber, with the distributor flute being located at the end thereof, the second pipe serving to convey the precursors in the vapor phase towards the distributor flute;

the second pipe presents, in its bottom portion, a gas-expansion pre-chamber, e.g. in the form of a double cone, and presenting a length that does not exceed 500 mm;

an injector is provided to inject precursors in liquid form into the second pipe;

means are provided for feeding the second pipe with a gas stream; and means are provided for feeding the second chamber with a fluidizing gas stream, which means comprise one or more inert gas reservoirs connected to the second chamber.

BRIEF DESCRIPTION OF THE DRAWINGS

Other characteristics, objects, and advantages of the invention are set out in the following detailed description made with reference to the figures, in which.

DETAILED DESCRIPTION

Figure 1:
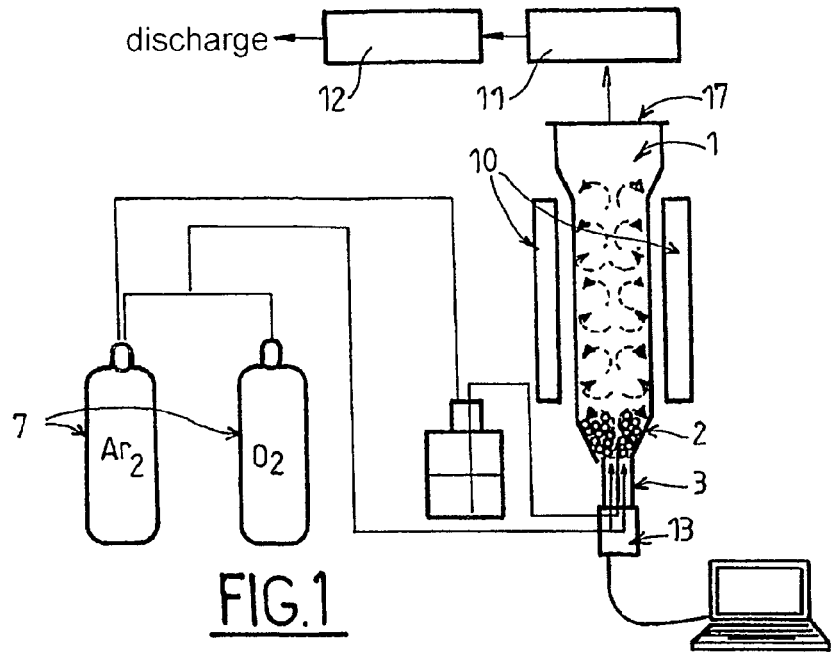
FIG. 1 is a diagrammatic overall view of the device of the invention, shown with its gas and precursor feed means.

The following detailed description makes reference to the various figures without necessarily specifying which one.

The device comprises a first chamber 1 having a fluidized bed containing support grains 2 of spherical or similar shape, and a second chamber 3 in fluid-flow connection with the first chamber 1.

The first chamber 1 constitutes a reactor in which the deposition operation proper takes place. The outer enclosure of said first chamber 1 is constituted by a quartz tube or a metal tube. By way of example, its diameter is 100 mm and its height lies in the range 600 mm to 1000 mm. These dimensions are not specific in any way, and are selected merely as a function of the quantity of support grains and as a function of the equipment to be inserted therein.

The second chamber 3 serves to deliver, in vapor form (reactive gas form), precursors of the chemical species that are to be deposited on the support grains.

For this purpose, a pipe 4 is provided that is completely leaktight relative to the second chamber 3, with precursors of the chemical species for depositing on the support grains being introduced into the bottom of the pipe, together with vector gases that form the reactive gases after the precursor liquid has evaporated. More precisely, the pipe 4 has an expansion pre-chamber 41 into which precursors are injected in liquid form (injector 13) together with vector gases (openings 14). By way of example, the pipe 4 may be a tube of small diameter, i.e. lying in the range 8 mm to 12 mm, e.g. 10 mm, and it may be straight and short, i.e. it may have a length of less than 500 mm, e.g. 450 mm. By way of example the pre-chamber 41 is in the form of a double cone located at the bottom portion of the pipe 4, and thus at the bottom portion of the second chamber 3.

The introduction of precursors into such a pipe, i.e. having a pre-chamber 41 associated with a short length is original; the solutions that are usually employed consider that an indirect evaporation path and an evaporation length of at least 650 mm are essential.

The device also provides heater means 5, e.g. extending along the outer wall of the second chamber 3 in order to put the precursors into the vapor phase. The heater means may for example deliver temperatures lying an the range 120° C. to 280° C., which temperature may be regulated by implementing thermocouples.

The precursors, e.g. organometallic precursors, are injected while in liquid form. Liquid injection makes it possible to control the quantities of precursors that are injected into the device, and consequently to control the rate at which chemical species deposition growth takes place on the support grains, and also to control the thickness of the deposited layers.

The second chamber 3 also serves to convey a fluidizing gas towards the first chamber 1. It thus provides one or more inlets 31 for one or more fluidizing gases.

Thereafter, the device also provides means for feeding the second chamber 3 with a fluidizing gas stream, which means comprise one or more gas reservoirs 7 connected to the second chamber 3. The term "gas" is used herein to mean inert gases (argon, nitrogen, helium) or a mixture of inert and reactive gases that may contain as much as 80% reactive gas (oxygen, hydrogen). These means 7 also serve to feed vector gas to the pipe 4 in which the precursors evaporate.

The device also has a fluidizer element 8 disposed in the first chamber 1 to receive the support grains 2.

The fluidizer element 8 is advantageously in the form of a cone, or more generally of a shape that is adapted to performing a funnel function serving to bring together the support grains for treatment in register with or in the proximity of the outlet portion of the distributor flute 9 as described in detail below.

For simplification purposes, the description below is based on the advantageous embodiment having a fluidizer "cone" 8 for the element in question, but this does not limit in any way the scope of the invention, which covers any element suitable for performing the same function; i.e. any fluidizer element having a funnel shape.

In its bottom portion, the fluidizer cone 8 is in the form of a cone or funnel that facilitates entry of fluidizing gases. The fluidizing gases pass from the second chamber 3 to the fluidizer cone 8 via a peripheral space that is provided between the cone 8 in question and a distributor flute 9 that is described in detail below.

Figure 3:
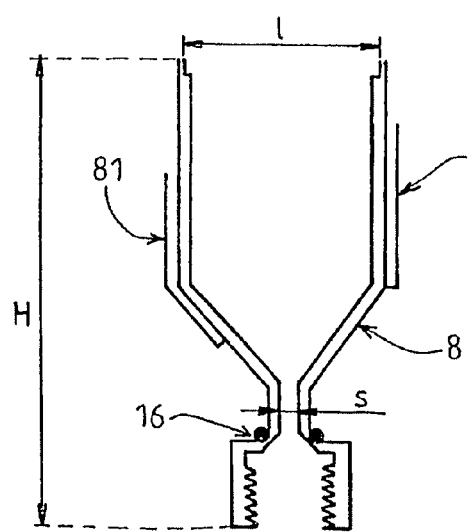
FIG. 3 is a view of a fluidization element implemented in the reactor of the device of the invention.

The fluidizer cone 8 may be made of a conductive material, e.g. inconel, stainless steel, or copper. In the non-limiting example shown in FIG. 3, its total height H is H=175 mm, its width l=65 mm, and its flow section presents a diameter s in which the distributor flute 9 is to be inserted that is of the order of s=5 mm.

The fluidizer cone 8 includes grooves 81 in its outer periphery, which grooves are used for receiving thermocouples.

The device includes heater means 10 making use of the information delivered by the thermocouples located in the grooves 81 and serving to regulate the temperature in the first chamber 1. The heater means 10 may be formed by a resistive furnace mounted on a slideway and thus capable of surrounding the first chamber 1 or of moving away therefrom, the furnace thus serving to adjust the temperature gradient between the first chamber 1 and the second chamber 3. It is also possible to envisage using an induction furnace. The heater means 10 may deliver a temperature that is adjustable over the range 320° C. to 700° C., for example.

At its top end, the fluidizer cone 8 may also include a stopper 82 having the function of limiting or preventing support grains of small sizes, typically powders having grain sizes of less than micrometer (μm) order, from escaping from the volume defined by the fluidizer cone 8.

The device includes a flute 9 disposed at the inlet of the fluidizer cone 8, in particular for controlling the distribution of precursors in the vapor phase within the fluidizer cone 8.

The distributor flute 9 comprises an inner pipe 91 for passing the precursor vapors and of section that varies. More precisely, the ratio between the inlet section diameter $D_e$ for precursor vapors in the inner pipe 91 and the outlet section diameter $D_s$ of the pipe 91 is at least 2, and preferably lies in the range 5 to 15. For example, an inlet section may be provided having a diameter $D_e$=10 mm, approximately, while the diameter of the outlet section is $D_s$=1 mm. The fact of having a tapering flow section (the pipe 91 is of conical shape) for the gas stream serves to accelerate the speed of the gas containing the precursors, thereby preventing any condensation and/or deposition within the distributor flute 9.

Figure 4A:
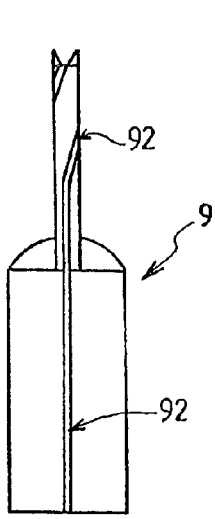
FIGS. 4a to 4c are a plurality of views, respectively an outside view, a section view, and a plan view, of a flute for distributing reactive gases, i.e. precursors put into vapor form.
Figure 4B:
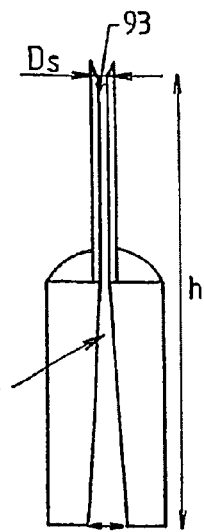
Figure 4C:
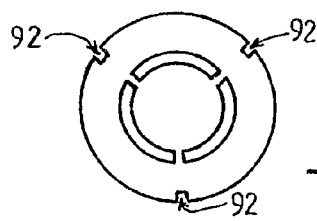

Advantageously, the variation in the section of the inner pipe 91 is continuous along the flute 9 so as to form a cone. Optionally, the inner pipe 91 may present a conical portion followed by a portion of constant section equal to the smallest section of the cone, as shown in FIG. 4b.

The distributor flute 9 is also arranged relative to the fluidizer cone 8 in such a manner that the fluidizing gases pass between the outer portion of the flute 9 and the fluidizer cone 8.

Given this flow, the distributor flute 9 has one or more outer grooves 92. These outer grooves 92 may be oriented along the longitudinal axis of the flute 9 or they may present a first portion that is oriented along the longitudinal axis of the flute and a second portion that winds helically around said axis.

With a helical portion, the helical winding serves to generate a vortex of fluidizing gas within the first chamber 1. The vertical inclination of the or each outer groove 92 is less than 30°, and more generally lies in the range 0° to 20°. It is selected as a function of the support grains 2 that are to be fluidized so as to ensure that the support grains 2 are stirred effectively and uniformly within the fluidized bed. For example, it will be understood that the larger the support grains, the more preferable it is to generate a considerable vortex.

The distributor flute 9 may have up to twelve outer grooves, of width lying in the range 0.3 mm to 1.2 mm and of depth lying in the range 0.3 mm to 1.2 mm. In particular, the number of outer grooves 92 is determined as a function of the size of the support grains to be treated. The larger the support grains, the more it is preferable to make use of a distributor flute having few outer grooves (inverse proportionality), presenting dimensions that are large (depth and width being of millimeter order). In contrast, the smaller the size of the support grains, the more it is preferable to implement a distributor flute 9 having numerous outer grooves, presenting dimensions that are small (depth and width then being of the order of 0.3 mm). Naturally, the dimensions may be modified as a function of requirements by the person skilled in the art.

The distributor flute 9 also has a recess 93 of shape that enables shutter means, e.g. a ball of diameter lying in the range 3 mm to 7 mm, to be placed in such a manner as to enable the outlet orifice of the inner pipe 91 to be closed (diameter $D_s$). Thus, when no gas stream is passing along the pipe 91, the outlet orifice of the pipe 91 is shut, thereby preventing the support grains 2 from passing into the distributor flute 9.

Advantageously, the flute 9 is inserted into the base of the fluidizer cone 8 so as to leave a space d' lying in the range 0.2 mm to 0.6 mm for passing the fluidizing gases.

By way of example, the distributor flute 9 may be made of a material such as inconel.

A flange 15 is provided at the interface between the two chambers 1 and 3. The flange 15 is fitted with a heat shield, preferably constituted by five stainless steel rings of small thickness, e.g. 1 mm, each of them being spaced apart by a washer, likewise made of stainless steel. This shield serves firstly to return thermal radiation associated with the temperature level that exists inside the chambers 1 and 3 towards the fluidizer cone 8; it also serves to protect the base of the distributor flute 9 from an excessive temperature gradient that might exist at said interface between the two chambers 1 and 3.

Figure 2:
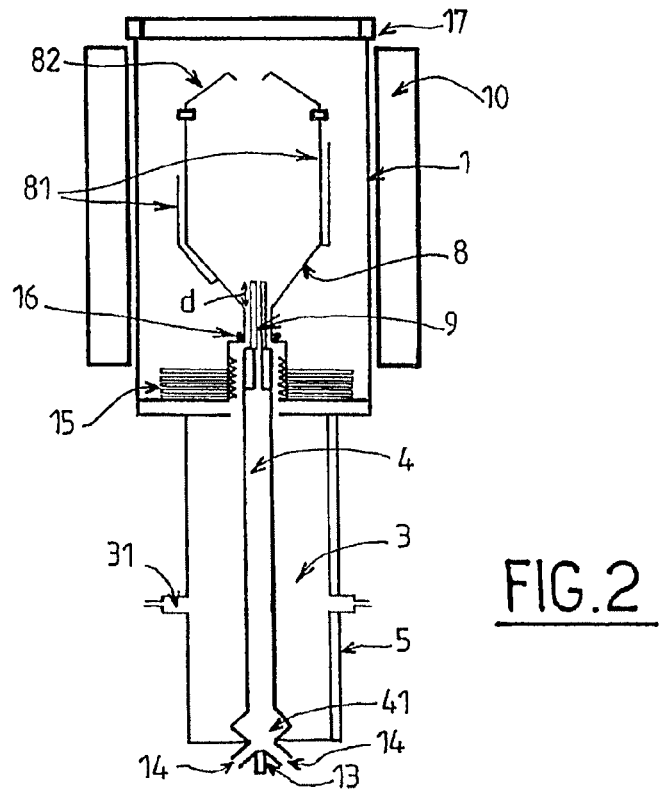
FIG. 2 is a larger scale view of the device of the invention showing the chambers of the device, i.e. the evaporator and the reactor.

The precise location of the distributor flute 9 relative to the fluidizer cone 8 can be adjusted. For this purpose, the device provides means (not shown) for adjusting the position of the outlet of the distributor flute 9 relative to the inlet of the fluidizer cone 8 (varying the distance d in FIG. 2). These means thus serve to vary the flow section allowed for the gas that fluidizes the support grains, which section is situated between the cone 8 and the distributor flute 9.

Thus, depending on its positioning, the distributor flute 9 serves to control the distribution of the fluidizing gases within the fluidizer cone 8.

It will be understood that the greater the size of the support grains 2, the more it is preferable to allow a considerable passage between the fluidizer cone 8 and the distributor flute in order to fluidize the grains.

These adjustment means thus provide alternative or additional adjustment means over selecting a flute 9 that has outer grooves of number and/or helical pitch that is appropriately chosen.

At the base of the fluidizer cone 8, the device may also include heater means 16, e.g. heater cartridges and/or cooling means 16 for controlling the temperature gradient in the deposition zone. This makes it possible to limit or even avoid any clogging of the inlet of the fluidizer cone by the support grains.

Although the enclosure formed by the first chamber 1 is closed (e.g. having a quartz window 17 on the top portion of the first chamber 1), the device includes a so-called "very high efficiency" particle filter serving to trap any powders that might potentially be present at the outlet from the first chamber 1. The filter 11 is followed by a pump 12 that sets the various gas streams into movement through the device. By placing the filter 11 upstream from the pump 12 (relative to the flow direction of the gas stream), it is possible to protect the pump. The pump 12 may perform "dry" pumping, however a vane pump may also be suitable, except when use is made of methane or of hydrogen ($H_2$).

There follows a detailed description of certain reacts of deposits that can be performed with the device of the invention.

Making a high-performance catalyst requires two steps:
step 1: a step of depositing a "washcoat" (i.e. a catalytic pre-layer made up of one or more oxides); and
step 2: a step of dispersing metals, usually noble metals, in the form of nanoparticles (generally of diameter less than 20 nm) on the previously-deposited "washcoat".

Example 1

A first example of implementing the invention consists in depositing (step 2) particles of platinum (nobel metal) on beads of alumina forming support grains, for use in volatile organic compound (VOC) treatment applications.

The beads have a diameter of about 2 mm, and present a total weight lying in the range 1.5 grams (g) to 12 g, being placed directly in the fluidizer cone 8 of the first chamber 1 and being stirred (made to form a fluidized bed) by a stream of argon, while being heated by the furnace 10.

The working pressure inside the reactor lies in the range 5 torr to 40 torr, the total gas flow rate being 80 standard cubic centimeters per minute (sccm) to 250 sccm with an argon content lying in the range 20% to 40%, the liquid precursor used being Pt(acetylacetone) diluted in toluene at a concentration of 0.03 moles per liter (mol/L). The precursor is injected at a frequency of 2 hertz (Hz) with an open time of 3 milliseconds (ms).

For deposition times of less than 30 seconds (s), dispersed deposits of nanoparticles are obtained; beyond that, if the deposition time increases further, continuous or discontinuous layers are obtained.

Particle size lies in the range 50 nm to 200 nm as a function of operating conditions such as the temperature that exists within the reactor (first chamber 1), deposition time, etc. . . . .

Example 2

This second example of implementing the invention relates to the field of using hydrogen storage materials. It consists in depositing (step 2) metals in the form of nanoparticles onto macroporous powders of $TiO_2$ or of $MnO_2$. The size of the support grains forming the $TiO_2$ powder is less than 25 nm, and the size of the support grains forming the $MnO_2$ powder is less than 10 μm.

These powders, presenting a total weight lying in the range 0.5 g to 5 g, are placed directly in the fluidizer cone 8 and stirred (put into a fluidized bed) by a stream of argon, while being heated by the furnace 10.

The working pressure inside the reactor lies in the range 40 torr to 750 torr, the total gas flow rate lies in the range 100 sccm to 200 sccm, with an argon content lying in the range 40% to 80%, with the precursors used being Pt(acetylacetone) or Pd(acetylacetone) diluted in toluene at a concentration of 0.03 mol/L. The precursor flow is injected at a frequency of 2 Hz with an open time of 3 ms, so as to provide a precursor flow rate of 1.9 milliliters per minute (mL/min).

The temperature of the evaporator (leaktight pipe 4 arranged in the second chamber 3) was set at 160° C., while the deposition temperature (furnace 10) was set at 320° C.

With such operating conditions, the rate at which Pt (platinum) metal is loaded onto the $TiO_2$ support grains is 5% by weight, and the rate at which Pt is loaded onto the $MnO_2$ support grains is 6.4% by weight, the rate at which Pd (palladium) is loaded onto $TiO_2$ support grains is 3.9% by weight, and the rate at which Pd is loaded onto $MnO_2$ support grains is 5% by weight.

Specific surface area measurements performed in liquid nitrogen show that the samples as treated in that way are mesoporous (whereas the initial powders were macroporous) having a mean pore diameter of 8.5 nm with a Specific surface area of 135.46 square meters per gram ($m^2/g$) for $TiO_2$ support grains and 26.14 $m^2/g$ for $MnO_2$ support grains.

Measurements of hydrogen storage capacity were performed in liquid nitrogen by taking volume differences using Sievert type equipment. Thus, when comparing $TiO_2$ on its own with Pt-doped $TiO_2$, the hydrogen storage capacity is multiplied by three under a hydrogen pressure of 10 bars. Even better performance levels were obtained with Pt-doped $MnO_2$ powder under a hydrogen pressure of 10 bars.

Figure 5:
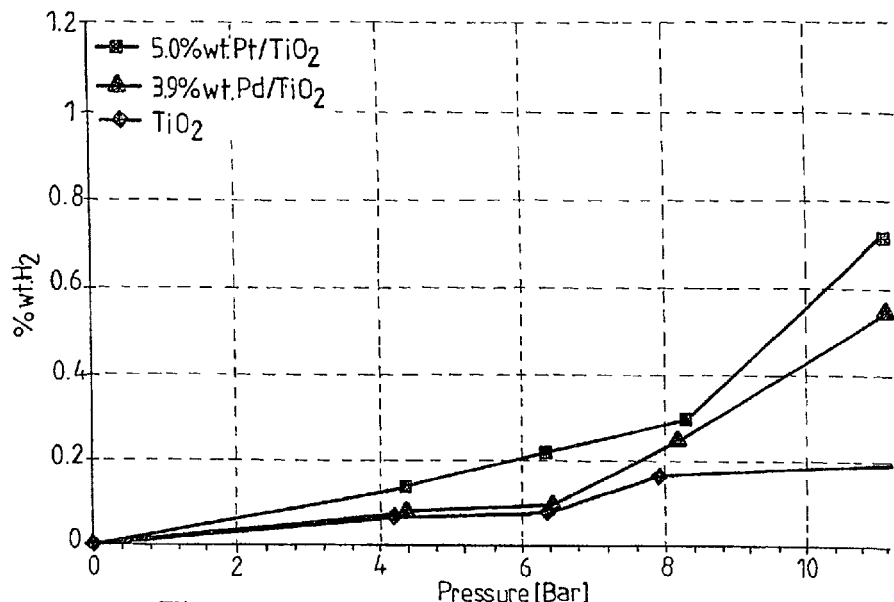
FIG. 5 shows comparative results of a catalyst using $TiO_2$ alone, or with palladium, or with platinum, on hydrogen storage capacity as a function of hydrogen pressure as obtained with the device of the invention.

The comparative results obtained for $TiO_2$ alone, $Pt/TiO_2$, and $Pd/TiO_2$ are shown in FIG. 5. This figure shows the variation in the weight of hydrogen captured by the support grains (hydrogen storage capacity) as a function of hydrogen pressure.

Figure 6:
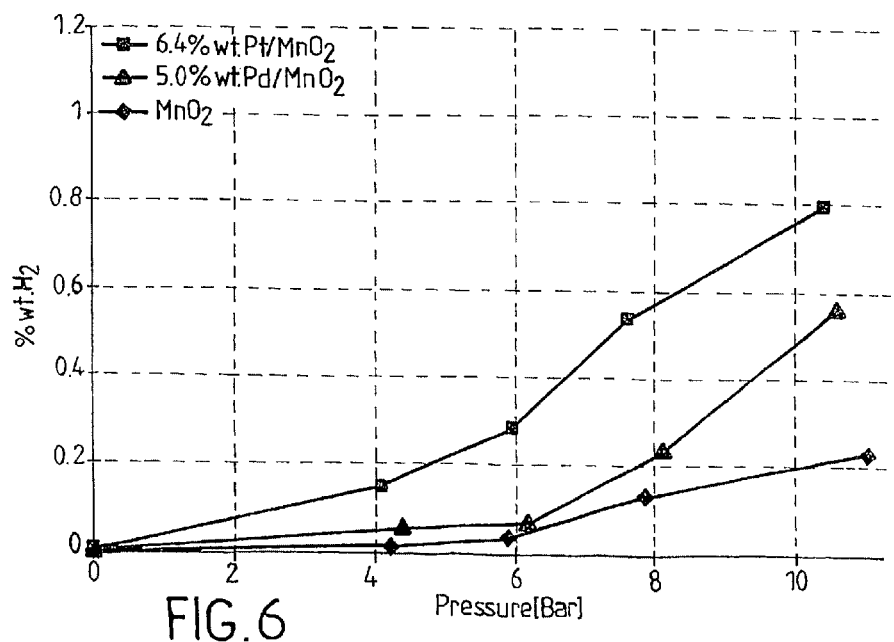
FIG. 6 shows comparative results of a catalyst using $MnO_2$ alone, or with palladium, or with platinum, on hydrogen storage capacity as a function of hydrogen pressure as obtained with the device of the invention.
Figure 7:
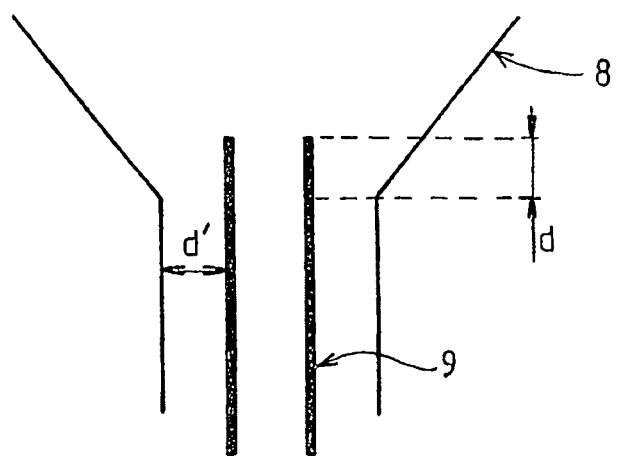
FIG. 7 is a view enlarged relative to FIG. 2 showing the interface between a fluidization element of the device for receiving support grains of spherical or similar shape and a distributor flute of the device for providing precursors in vapor form of the chemical species for depositing on the support grains and for conveying a fluidizing gas towards the first chamber, i.e. the reactor.

Comparative results obtained for $MnO_2$ alone, $Pt/MnO_2$, and $Pd/MnO_2$ are shown in FIG. 6. This figure likewise shows variation in the weight of hydrogen captured by the support grains (hydrogen storage capacity) as a function of hydrogen pressure.

To sum up, because of the various adjustment means of the device that are specifically designed for powder or grain type structures, the device is capable of depositing chemical species on support grains 2 presenting a large range of sizes, e.g. support grains presenting a diameter lying in the range 50 nm to a few millimeters.

Furthermore, deposition on the support grains may also be performed in uniform manner by controlling the fluidized bed (using the pair constituted by the fluidizer cone and the flute, and in particular by adjusting their respective positioning; the shape and number of outer grooves in the flute), thereby ensuring that the support grains are thoroughly stirred. The term "uniform" is used herein to mean that all of the support grains have a deposit made thereon and that the thickness and/or distribution of the deposit is comparable from one support grain to another.

Furthermore, by injecting precursors in liquid form, the device makes it possible to control the quantity of precursor that is supplied in vapor form throughout the deposition operation. It is thus possible, unlike devices that use precursors in solid form, to control the rate of growth of the layer deposited on the support grains, and consequently to control the thickness of said deposition layer as a function of the duration over which the method is carried out.

This factor concerning the length of time over which the method is carried out in combination with injecting precursors in liquid form even makes it possible to deposit continuous or discontinuous layers on the support grains, with this being possible regardless of whether the grains are dense or porous, given the control of the fluidized bed as provided by the device.

More generally, controlling the operating conditions as made possible by the present device enables the morphology (size) and the concentration (dispersion) to be modulated and thus makes it possible to synthesize particles of nanometric size (e.g. less than 10 nm) that are very finely dispersed (inter-particle distance of less than 50 nm).

It has been found that deposition time is also considerably shortened compared with existing devices. Typical deposition times with the device of the invention are a few tens of seconds, whereas with known devices they are of the order of a few tens of minutes or even longer.

Finally, the device of the invention makes it possible not only to deposit metallic chemical species (referred to above as step 2) onto a "washcoat", but it also makes it possible to deposit complete catalytic systems ("washcoat"+metal) using the same device. It is thus possible with the device of the invention to deposit chemical compounds of the oxide type in thin layers ($Al_2O_3$, $CeO_2$, YSZ, $V_2O_5$, BaO, $TiO_2$, . . . ) followed by metallic chemical species (Fe, Ru, Os, Co, Rh, Ir, Ni, Pd, Pt, Cu, Ag, Au, . . . ) in the form of nanoparticles.

The invention claimed is:

1. A device for vapor deposition of chemical species on support grains of spherical or similar shape disposed in a fluidized bed, the device comprising:
   a first chamber including a fluidized bed in which a funnel-shaped fluidizer element is housed to receive support grains of spherical or similar shape;
   a second chamber in fluid flow connection with the first chamber to deliver precursors in a vapor phase of chemical species to be deposited on the support grains and to convey a fluidizing gas towards the first chamber, said second chamber having a pipe to deliver precursors in a vapor phase of chemical species to be deposited on the support grains, said pipe passing through the second chamber and being leaktight relative to the second chamber and further presenting a gas-expansion pre-chamber; and
   a distributor flute at an inlet to the fluidizer element to control distribution of the vapor phase precursors and of the fluidizing gas within the fluidizer element, said distributor flute comprising an inner pipe to convey the precursors in the vapor phase from the pipe passing through the second chamber within the fluidizer element and arranged relative to the fluidizer element in such a manner that the fluidizing gases coming from the second chamber pass between the outer portion of the distributor flute and the fluidizer element, said fluidizer including one or more outer grooves, the outer groove or each of the outer grooves including a first portion vertically oriented along the longitudinal axis of the flute and parallel to said axis and a second portion winding helically around said longitudinal axis to generate a fluidizing gas vortex within the first chamber.

2. A device according to claim 1, the inner pipe is of varying section.

3. A device according to claim 2, wherein a ratio between a diameter of the precursor vapor inlet section into the inner pipe of the distributor flute and a diameter of an outlet section from said inner pipe is at least 2, or lies in a range of 5 to 15.

4. A device according to claim 1, wherein the helical portion of the or each outer groove has a vertical inclination of less than 30°, or of less than 20°.

5. A device according to claim 1, wherein the or each outer groove presents a width lying in a range of 0.3 mm to 1.2 mm, and a depth lying in a range of 0.3 mm to 1.2 mm.

6. A device according to claim 1, wherein one end of the distributor flute includes a recess of a shape that allows shutter means to be placed therein.

7. A device according to claim 1, further comprising means for adjusting a position or outlet of the distributor flute relative to an inlet of the fluidizer element.

8. A device according to claim 1, further comprising heater means and/or cooling means located at a base of the fluidizer element, to avoid an inlet of the fluidizer element being clogged by the support grains.

9. A device according to claim 1, wherein the pipe passing through the second chamber presents a length that does not exceed 500 mm.

10. A device according to claim 1, further comprising an injector to inject precursors in liquid form into the pipe passing through the second chamber.

11. A device according to claim 1, further comprising means for feeding the pipe passing through the second chamber with a gas stream.

12. A device according to claim 1, further comprising means for feeding the second chamber with a fluidizing gas stream, which means comprises one or more inert gas reservoirs connected to the second chamber.

13. A device according to claim 1, wherein the gas expansion pre-chamber is in a form of a double cone located at the bottom portion of the pipe passing through the second chamber.

14. A device according to claim 1, wherein the distributor flute is located at the end of the pipe passing through the second chamber.

* * * * *